(12) United States Patent
Bluck et al.

(10) Patent No.: US 10,418,260 B2
(45) Date of Patent: Sep. 17, 2019

(54) IN LINE FAN OUT SYSTEM

(71) Applicant: Intevac, Inc., Santa Clara, CA (US)

(72) Inventors: Terry Bluck, Santa Clara, CA (US);
Terry Pederson, Sunnyvale, CA (US);
William Eugene Runstadler, Jr.,
Livermore, CA (US)

(73) Assignee: INTEVAC, INC., Santa Clara, CA (US)

( * ) Notice: Subject to any disclaimer, the term of this patent is extended or adjusted under 35 U.S.C. 154(b) by 0 days.

(21) Appl. No.: 15/690,211

(22) Filed: Aug. 29, 2017

(65) Prior Publication Data

US 2018/0061689 A1 Mar. 1, 2018

Related U.S. Application Data

(60) Provisional application No. 62/380,927, filed on Aug. 29, 2016.

(51) Int. Cl.
*H01L 21/67* (2006.01)
*H01L 21/673* (2006.01)
(Continued)

(52) U.S. Cl.
CPC ...... *H01L 21/67201* (2013.01); *H01L 21/561* (2013.01); *H01L 21/67017* (2013.01);
(Continued)

(58) Field of Classification Search
CPC ................................................ H01L 21/67201
See application file for complete search history.

(56) References Cited

U.S. PATENT DOCUMENTS 5,215,420 A * 6/1993 Hughes ............... G11B 5/8404
118/719
5,849,370 A 12/1998 Lee et al.
(Continued)

FOREIGN PATENT DOCUMENTS

JP 2013-045877 A 3/2013
TW 201336098 A1 9/2013
(Continued)

OTHER PUBLICATIONS

International Search Report and Written Opinion for PCT/US2017/049210 dated Oct. 30, 2017.
(Continued)

*Primary Examiner* — William A Harriston
(74) *Attorney, Agent, or Firm* — Womble Bond Dickinson (US) LLP; Joseph Bach, Esq.

(57) ABSTRACT

A system for fan out chip encapsulation processing is provided, wherein a plurality of microchips are encapsulated in molding compound, the system comprising: an atmospheric loading camber, configured to load substrates onto carriers in atmospheric environment; an entry loadlock arrangement configured to introduce the carriers into vacuum environment of the system; a degas chamber positioned downstream of the loadlock arrangement within the vacuum environment, the degas chamber comprising a heating element and a pumping arrangement to remove gases emitted from the molding compound; an etch chamber positioned downstream of the degas chamber and within the vacuum environment, the etch chamber comprising an ion beam generator and an ion neutralizer; a metal sputtering chamber positioned downstream of the etch chamber and inside the vacuum environment; and, an exit loadlock arrangement configured to remove carriers from the vacuum environment.

18 Claims, 3 Drawing Sheets

(51) Int. Cl.
*H01L 21/677* (2006.01)
*H01L 21/687* (2006.01)
*H01L 21/768* (2006.01)
*H01L 21/56* (2006.01)

(52) U.S. Cl.
CPC .... *H01L 21/6776* (2013.01); *H01L 21/67121* (2013.01); *H01L 21/67173* (2013.01); *H01L 21/67207* (2013.01); *H01L 21/67303* (2013.01); *H01L 21/67754* (2013.01); *H01L 21/68721* (2013.01); *H01L 21/768* (2013.01); *H01L 21/565* (2013.01); *H01L 2224/96* (2013.01); *H01L 2924/3511* (2013.01)

(56) References Cited

U.S. PATENT DOCUMENTS

| | | | |
|---|---|---|---|
| 6,183,564 | B1 | 2/2001 | Reynolds et al. |
| 6,497,734 | B1 | 12/2002 | Barber et al. |
| 2003/0053894 | A1 | 3/2003 | Matsumoto |
| 2005/0045616 | A1 | 3/2005 | Ishihara |
| 2007/0130738 | A1 | 6/2007 | Ashizawa |
| 2010/0006425 | A1 | 1/2010 | Fu et al. |
| 2010/0028529 | A1 | 2/2010 | Yamanaka et al. |
| 2011/0117702 | A1* | 5/2011 | Rietzler ............... H01L 21/561 438/113 |
| 2011/0206485 | A1 | 8/2011 | Clerkx et al. |

FOREIGN PATENT DOCUMENTS

| | | |
|---|---|---|
| TW | 201348484 A | 12/2013 |
| TW | 201413030 A | 4/2014 |
| TW | 201436653 A | 9/2014 |
| TW | I644383 B | 12/2018 |
| WO | 2018/044947 A1 | 3/2018 |

OTHER PUBLICATIONS

International Preliminary Report on Patentability for PCT/US2017/049210 dated Mar. 14, 2019.

Examination Report for Taiwanese Patent Application No. 106129225 dated May 25, 2018.

Notice of Allowance for Taiwanese Patent Application No. 106129225 dated Aug. 29, 2018.

* cited by examiner

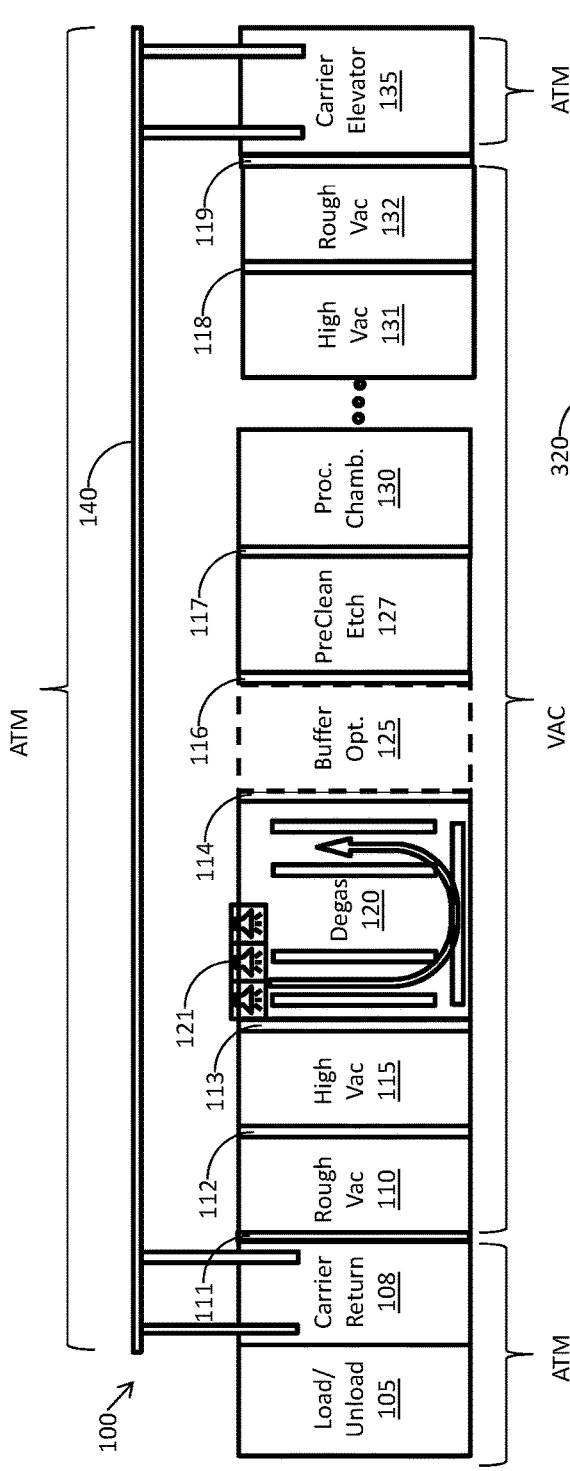
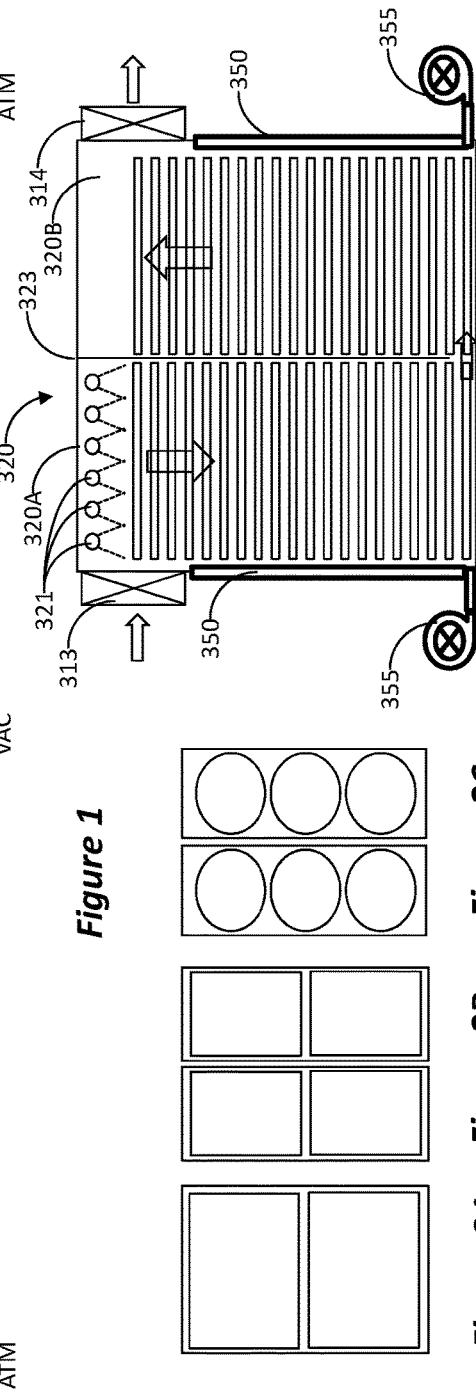
*Figure 1*
*Figure 2A*  *Figure 2B*  *Figure 2C*
*Figure 3*

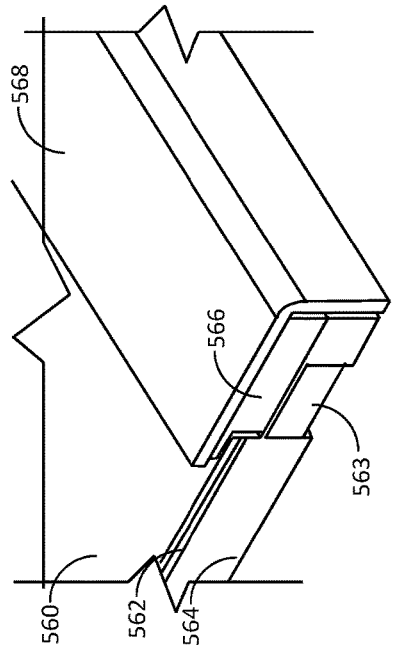
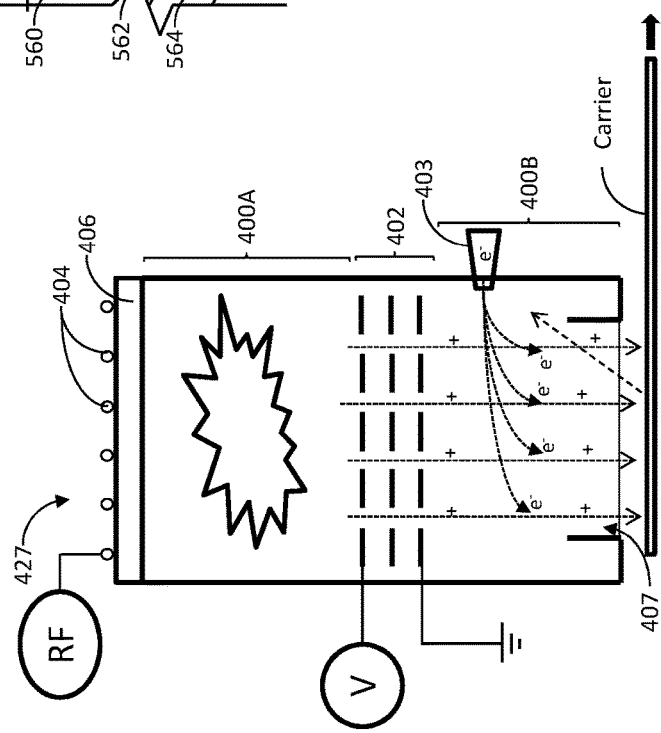
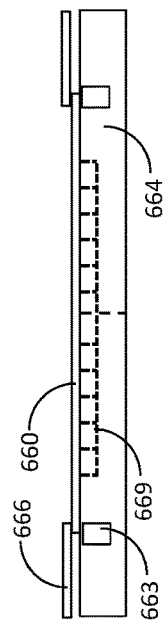
Figure 5
Figure 4
Figure 6

IN LINE FAN OUT SYSTEM

RELATED APPLICATION

This Application claims priority benefit from U.S. Provisional Application No. 62/380,927, filed on Aug. 29, 2016, the disclosure of which is incorporated herein by reference in its entirety.

BACKGROUND

1. Field

The disclosed invention relates to packaging of microchips and, more specifically, to packaging microchips using fan-out wafer or panel level packaging.

2. Related Art

There are two major advanced semiconductor packaging technologies considered as members of the fan-out packaging family. The two are Fan-Out Wafer Level Packaging (FOWLP), and Fan-Out Panel Level Packaging (FOPLP). For FOWLP, a saw is used to singulate dies from a processed wafer having multiple completed chips thereupon. The individual dies are then placed on a wafer-shaped substrate and overlaid to be embedded in a low cost material such as epoxy mold compound (EMC), polyimide, etc. (referred to collectively herein as molding compound). This forms a sacrificial wafer, generally referred to as reconstituted wafer, with spaces allocated between each die for additional I/O connection points. Redistribution Layers (RDL) are then formed to re-route I/O connections on the dies to the mold compound regions in the periphery. Since the reconstituted wafer is of similar size and shape as standard silicon wafer, the RDL processing can be done using standard semiconductor processing systems.

While molding compound is a cost-effective material for this application, it readily absorbs moisture when exposed to atmosphere. Outgassing from the molding compound during the redistribution formation can have detrimental effects on device contact resistance (known as $R_C$ or $R_{VIA}$) so an effective degas process is essential. However, the molding compound material has low thermal budget of less than about 120° C. to prevent decomposition and excessive wafer warp. Consequently an effective degas requires low temperature and long process time, thereby significantly reducing system throughput on traditional single wafer-based degas systems.

Fan-Out Panel Level Packaging is somewhat similar to FOWLP, except that the chips are arranged on a large tray, generally rectangular, and the mold material is flown over the tray. Due to the size and shape of the panel, the RDL cannot be processed in standard semiconductor processing equipment, however depending on size, it may be processed using flat panel display equipment, generally referred to as Gen 2 or Gen 3.

A solution is needed that enable processing FOWLP and FOPLP for forming the redistribution layers while maintaining high throughput, providing effective outgassing at low thermal budget, and cleaning the contacts without causing any damage to the chips and especially avoiding electrostatic damage (ESD).

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments disclosed herein describe solutions to the issues highlighted above. The embodiments enable processing FOWLP and FOPLP for forming the redistribution layers while maintaining high throughput, providing effective outgassing at low thermal budget, and cleaning the contacts without causing any damage to the chips and especially avoiding electrostatic damage (ESD).

Various embodiments and features are designed in order to perform the processing without breaking vacuum. This minimizes any possibility of oxidation of the contacts. However, each of the various processing requires different processing time. Thus solutions are provided to enable continuous processing in vacuum and account for the processing times.

According to disclosed embodiments, a system for fan out chip encapsulation processing is provided, wherein a plurality of microchips are encapsulated in molding compound, the system comprising an atmospheric loading camber, configured to load substrates onto carriers in atmospheric environment; an entry loadlock arrangement configured to introduce the carriers into vacuum environment of the system; a degas chamber positioned downstream of the loadlock arrangement within the vacuum environment, the degas chamber comprising a heating element and a pumping arrangement to remove gases emitted from the molding compound; an etch chamber positioned downstream of the degas chamber and within the vacuum environment, the etch chamber comprising an ion beam generator and an ion neutralizer; a metal sputtering chamber positioned downstream of the etch chamber and inside the vacuum environment; and, an exit loadlock arrangement configured to remove carriers from the vacuum environment.

According to disclosed aspects a degas chamber is provided, comprising: a first compartment and a second compartment, and a partition separating the first and second compartment, the partition having an opening enabling carriers to pass from the first compartment to the second compartment; an entry gate valve in the first compartment; a heater positioned in the first compartment; and, an exit gate valve position in the second compartment. The degas chamber may further comprise cryogenic and/or turbo molecular pumps. The degas chamber may also comprise: a lowering mechanism inside the first compartment configured to lower carriers one step at each processing cycle of the system; an elevating mechanism inside the second compartment configured to raise carriers one step at each processing cycle of the system; and, a linear transfer mechanism configured to horizontally transfer carriers from the first compartment to the second compartment at each processing cycle of the system.

According to further aspects an etch chamber is provided, comprising: a top compartment configured for sustaining plasma; a bottom compartment configured to form ion beam from ions extracted from the plasma; an extraction grid separating the top compartment and the bottom compartment, the extraction grid coupled to a voltage potential to extract ions from the plasma and into the bottom compartment; and, a neutralizer supplying electrons into the bottom compartment. The top compartment may further comprise a dielectric window, and the etch chamber further comprising an RF antenna positioned above the dielectric window.

According to further aspects, carriers are provided for fan-out processing system, each carrier comprising: a heat sink; a closed-cell pad positioned on top of the heat sink; and a frame configured to clamp a substrate on top of the closed-cell pad. The carriers may also comprise magnets positioned to attach the frame to the heat sink. The carriers may further comprise a cover provided over the frame to protect the frame from deposition particles.

The system may also include a return conveyor positioned above the processing chamber and in atmospheric environment. A rear elevator lifts carriers to the conveyor after the carriers exit the exit gate valve. A front elevator lowers carriers from the conveyor to the substrate exchange chamber to remove processed substrates and load fresh substrates onto the carriers.

According to further aspects, a method for processing fan-out substrates, comprising loading substrates onto carriers in atmospheric environment; transferring the carriers into loadlocks so as to introduce the carriers into a vacuum environment of the processing system; within the vacuum environment and without exiting the vacuum environment performing the steps: transferring the carriers into a degas chamber and heating the carriers upon entry into the degas chamber and thereafter allowing the substrates to cool while continually evacuating any gasses emitted from the substrates; transferring the carriers into an etch chamber and while in the etch chamber bombarding the substrates with neutralized ions; transferring the carriers through a series of deposition chambers and in each deposition chamber depositing a metal layer onto the substrates; transferring the carriers into exit loadlock to remove the carriers from the vacuum environment; once the carriers are removed from the vacuum environment, loading the carriers onto a conveyor and returning the conveyor to a substrate exchange station to unload the processed substrates and load fresh substrates.

Other features and aspects are described in the following Detailed Description with reference to the Drawings.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a diagram of a system for Fan-Out processing, according to disclosed embodiments.

FIGS. 2A-2C are illustrations of carriers for supporting different substrates, according to disclosed embodiments.

FIG. 3 is an illustrations of a degas chamber, according to disclosed embodiments.

FIG. 4 is an illustration of neutralized particle beam pre-clean process chamber, according to disclosed embodiments.

FIG. 5 is a cross section of a carrier, according to disclosed embodiments.

FIG. 6 is an illustration of a carrier, according to disclosed embodiments.

DETAILED DESCRIPTION

Figure 7:
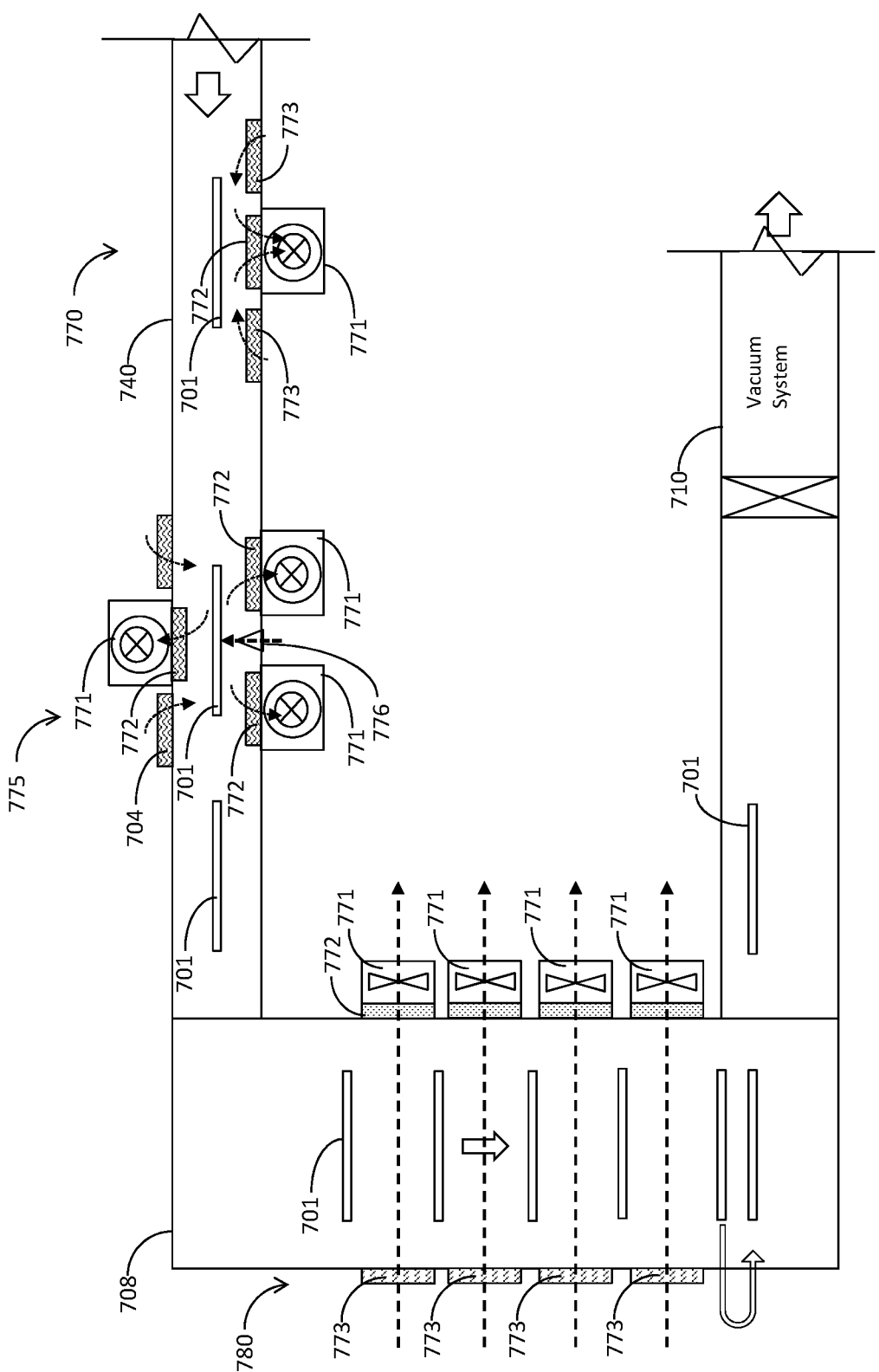
FIG. 7 illustrates an embodiment for removing particles from the carriers, according to disclosed embodiments.

Embodiments of the inventive Fan-Out processing system and method will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Various embodiments and features described below are designed in order to perform the fan-out processing serially and without breaking vacuum. This minimizes any possibility of oxidation of contacts and ensures that the metallization is formed on a well prepared, non-oxidized surface. However, each of the various processing requires different processing time. In this respect, for the purpose of this disclosure takt time refers to the time period between the start of processing of one unit and the start of processing of the next unit (including required unit transport and transfer time). For the different fan-out processing steps the takt time can vary drastically. For example, sputtering a conductive seed layer may be performed in takt time of one minute, while outgassing may require half an hour. Therefore, naturally these two processes are considered to be performed in two different systems. However, the current inventors considered that performing the two steps in different systems may lead to inferior contacts. Therefore, embodiments are devised to enable all processing to take place in a single system without breaking vacuum, in spite of the vastly different takt time.

FIG. 1 illustrates a general architecture of a system for fan-out processing according to one embodiment. The system in this embodiment is designed to place entry and exit into and from vacuum at strategic locations, providing faster transport and loading/unloading of substrates, while maintaining high quality processing inside the vacuum section. The system is designed to accommodate carriers, such as those shown in FIGS. 2A-2C. The carriers are designed to carry substrates in the form of either panels or reconstituted wafers. For example, FIG. 2A illustrates a wide carrier designed to carry two panels, each of, e.g., 450 mm by 650 mm. FIG. 2B illustrates two carriers, each configured to carry two 350 mm by 450 mm panels. FIG. 2C illustrates two carriers, each configured for carrying two reconstituted 300 mm wafers. For simplicity, throughout this disclosure the reconstituted wafers and the panels will be referred to as substrates, while the term carrier refers to any of the carriers illustrated in FIGS. 2A-2C.

As illustrated in FIG. 1, the system includes various modules for performing various functions. The system architecture is designed such that takt time is equal for each module, so that there's no idle time in any of the modules. The substrates are loaded onto carriers in the load/unload module 105, which operates in atmospheric environment. The carriers arrive from the atmospheric conveyor 140 through the carrier return elevator 108. The carriers are lifted onto the conveyor by carrier elevator 135 situated at the end of the system. The carrier return elevator 108, carrier elevator 135 and the conveyor are all in atmospheric pressure. Once loaded, carriers pass through the carrier return module and through the gate valve 111, and enter the rough vacuum module 110. The carrier return module accepts loaded carriers from the conveyor 140 for unloading processed substrate and loading fresh substrates. From the rough vacuum module 110 the carriers pass through gate valve 112 and enter high vacuum module 115.

Downstream of high vacuum module 115, processing is performed at high vacuum. However, outgassing from the molding compound can adversely affect the quality of the processing and, indeed, may lead to inoperable devices. Therefore, in this embodiment, once the substrates have entered the high vacuum environment, a degas process is performed. Normally degasing can be performed by heating the item to a high temperature. However, molding compounds used in fan-out devices cannot withstand high temperatures. Therefore, degasing must be performed at rather low elevated temperature (e.g., 120° C.) for longer time. However, heating the substrates for a long time would interfere with keeping the takt time constant at each of the modules. Moreover, the processing to be performed on the substrate adds heat, such that if the heated substrates move directly into the processing chambers the additional heat may surpass the thermal budget of the molding compound.

In this embodiment a unique degas chamber 120 is used, which is designed to match the takt time of the other chambers and at the same time enable preservation of thermal budget of the substrates. Specifically, in one example the degas chamber 120 is divided into two sections: in the first section the carriers enter at the top and heating elements 121 heat the substrates to the desired temperature. In one embodiment the heating elements 121 comprise an array of infrared lamps. In this first section the carriers travel downwards at each process cycle (see the U-arrow in FIG. 1). During that time gasses emitted due to the heating of the substrate are pumped out, and the substrates begin to cool. When the substrates reach the bottom of the first section they travel horizontally to the second section. The second section is also continually pumped to remove any gasses still emitted from the molding compound. In the second section the carrier travels upwards at each cycle, and when a carrier reaches the top of the second section it travels horizontally to exit the degas chamber 120 through gate valve 114. Thus, beginning with the top position on the first section, the carrier travels at each processing cycle to another position within the degas chamber 120. The number of position is configured so as to maintain constant takt time. For example, when takt time is set for one minute, and it is determined that proper cycle of heating, degassing and cooling of the substrates takes 30 minutes, the degas chamber 120 is designed to have 30 positions. Consequently, every minute one new carrier enters the degas chamber 120 and one degassed and cooled carrier exits the degas chamber 120.

An example of a degas chamber that can be used in the system of FIG. 1 is illustrated in FIG. 3. Degas chamber 320 has two compartments, 320A and 320B, separated by partition 323. Partition 323 does not extend all the way to the floor, such that there is an opening on the bottom enabling a carrier to horizontally pass from compartment 320A to compartment 320B. The carriers enter via gate valve 313 at the top of the first compartment 320A of degas chamber 320, and the substrates are heated by heaters 321. At each processing cycle, the carrier is then lowered one step in the direction of the arrow. Once the carrier reaches the bottom, it is moved horizontally to the second compartment 320B. The movement then reverses and the carrier moves up at each cycle until it reaches the top. It then exits via gate valve 314. During the entire transport process outgassing is absorbed by cryonic plates or panels 350 and the compartments are pumped out by turbo molecular pumps 355.

Depending on the design, an optional buffer module 125 may be provided following the degas chamber 120. The buffer module 125 may be used to provide variability in the takt time and also provide additional time for substrate cooling. The buffer module 125 may be included when the system is designed to operate with different sizes of substrates, each requiring a different takt time. Alternatively, the motion of carriers inside the degas chamber can be controlled to match the takt time. For example, the size of each stepping down and up inside the degas chamber may be changed, so that in effect the carrier stays inside the degas chamber for fewer or more cycles.

The objective of the system of FIG. 1 is to form metal lines to fabricate the redistribution layers. However, in order to control contact resistance, prior to forming any metal connection, any oxidation in the prior contact layer must be removed. Also, once the oxides are removed, the substrate should be in controlled environment to ensure no further oxidation occurs prior to forming the metal lines and contacts. Therefore, in the embodiment of FIG. 1 a unique pre-clean etch chamber 127 is provided right before the metallization processing chamber 130. The pre-clean etch chamber 127 utilizes plasma to generate a neutralized particle beam that cleans by physical etching any oxidized contact prior to forming the metallization layer in chamber 130. Notably, in this embodiment the neutralized particle beam etches the entire surface of the substrate, i.e., the metal contacts and the molding compound. Etching the molding compound is beneficial as it helps adhere the sputtered metal to the underlying molding compound, to prevent peel or breakage of the deposited metal lines. Also, in this embodiment the ion beam generated from the plasma is neutralized, thereby providing a neutralized particle beam so as not to damage ESD sensitive devices.

FIG. 4 is an illustration of neutralized particle beam pre-clean (etch) chamber 427, according to disclosed embodiments. The pre-clean chamber 427 has a top compartment 400A and a bottom compartment 400B, which are separated by conductive grids 402. The top compartment 400A is configured for maintaining plasma by applying RF radiation from the coil 404 through the dielectric window 406, while the grid arrangement 402 is configured to extract ions from the plasma and accelerate the ions into the bottom compartment 400B. The bottom compartment is configured for forming a beam of ions extracted from the plasma and electrons emitted from the plasma bridge neutralizer 403, and direct the ions and electrons onto the substrate through aperture 407. A hot-filament, plasma-bridge, or hollow-cathode type of plasma bridge neutralizer may be used to introduce electrons into the bottom compartment 400B, such that the electrons may neutralize the positive ions extracted from the plasma. In this example, since a broad ion beam is generated, the density of electrons introduced into the beam may approximately equal the density of ions, so as to generate "space-charge neutralization". By introducing the electrons into the ion beam, charge build-up on the substrate is prevented. Also, by changing the precursor gas injected into the upper compartment, the type of ion species can be controlled. Similarly, by controlling the power of the RF radiation the density of the plasma can be controlled and by controlling the potential on the extraction grids the ion energy and density can be controlled. Therefore, this embodiment provides ability to precisely control the etching, while minimizing damage to the circuits within the substrate.

As noted, the pre-clean chamber etches the surface of the substrate, which may include simultaneously etching all exposed metal lines, metal contacts, molding compound, and any dielectric layers. Thereafter, while still in vacuum environment, the carrier is transferred to a first deposition chamber. To ensure processing while the metal lines are still clean, the first metallization chamber immediately abuts the pre-clean chamber, having a gate valve separating the two chambers. Thus, the carriers transfer from the pre-clean chamber directly into the first metallization chamber.

The metal layers are formed using a series of processing chambers, indicated by process chamber 130, followed by three dots—indicating a number of deposition chambers configured to provide the desired layers of the metallization. In one example, a first processing chamber is used to sputter titanium (Ti) and/or titanium tungsten (TiW), used, e.g., as good adhesion and barrier layer. The Ti and/or TiW layer can be formed using one or more processing chambers 130, depending on the thickness desired. The next layer is formed by sputter chambers that sputter copper (Cu) and/or aluminum (Al). Specifically, in the case of copper lines, the process chamber is used to sputter a thin layer of copper that forms as a seed for an electroplating step that follows after processing in the system of FIG. 1 is completed. In the case of aluminum, one or more sputtering chambers may be placed serially so as to form a rather thick aluminum layer that forms the actual conductive line, thus avoiding the need for electroplating, albeit at reduced electrical performance of the conductive lines.

As noted, control of thermal budget is very important. Accordingly, the carriers are configured to remove heat from the substrates during processing. One example is provided in FIG. 5, which is a cross section of a carrier. The example shown in FIG. 5 is for a rectangular carrier for a panel, but it may also be for a round reconstituted wafer. As illustrated in FIG. 5, the panel 560 is held onto the carrier by a frame 566. In this example the frame is secured by a magnet 563 and is protected from particle deposition by a cover 568. Following a certain number of processing cycles, when the cover 568 gets an unacceptable amount of deposited material, the cover may be cleaned or simply replaced. The body of the frame incorporates a heat sink 564. Clamping the panel to the heat sink 564 using the frame 566 ensures flatness of the panel during processing. Heat transfer from the panel 560 to the heat sink 564 is enhanced by closed-cells or other thermal transfer pad 562. When the carrier enters the vacuum conditions inside the system the closed-cells expand, thus forcing the closed-cell pad 562 into close contact with the panel 560 and the heat sink 564, such that heat transfer is enhanced. Also, when the carrier exits the vacuum environment of the system and is transported back on the overhead conveyor 140 (FIG. 1), the heat sink cools down and is ready to accept the next panel.

Another embodiment of the carrier is illustrated in FIG. 6. In FIG. 6 the substrate 660 is held onto the carrier's heat sink 664 by vacuum, which is applied using vacuum channels 669. This ensures flatness of the substrate during processing. Also, a frame or a mask 666 may be held using magnets 663, or other mechanical clamping arrangement.

For inline carrier based PVD systems, one of the major areas of concern is from the deposition on the carrier sides and bottom. Top side deposition is not a major source of particles as it is direct deposition from the source, not back scattered. Also if the particles on top are lose they generally do move from the surface. The embodiment illustrated in FIG. 7 addresses this concern of contamination from side/backside particles. Generally, the embodiment of FIG. 7 is configured to remove lose particles from the carrier side/backside and pull them away from the carriers. FIG. 7 illustrates several particle removal arrangements, any one or a combination of which may be implemented independently of the other. That is, a system may have one or a combination of the arrangements shown in FIG. 7.

In the embodiment of FIG. 7, while the conveyor 740 and carrier return elevator 708 are in atmospheric pressure, whey are both enclosed, thus creating a controlled clean environment inside. Carriers 701 are transported inside the enclosed conveyor 740 and enclosed elevator in the direction shown by the block arrow. Also, as shown by the U-shaped arrow, when the carrier reach the bottom of the carrier return elevator 708 it exits to the left so that processed substrates may be unloaded and fresh substrates be loaded onto the carrier 701. Then the carrier 701 returns to the elevator and proceeds to the rough vacuum 710.

A first particle removal arrangement is generally indicated at 770. An exhaust fan 771 pulls air out of the conveyor's interior, through an exhaust filter 772. In one embodiment the exhaust filter 772 is tackified so as to catch and retain the particles dislodged from the carrier. Fresh air is supplied via an opening that has intake filters 773. The air flow is indicated using the dotted-line arrows.

A second particle removal arrangement is generally indicated at 775. In this arrangement, several exhaust fans 771 are used to pull air out of the conveyor enclosure, each having a corresponding exhaust filter 772 (which may or may not be tackified). Additionally, or alternatively, free flow openings are provided with filters 704. An air knife 776 is located below the carrier and directs a stream of air or nitrogen onto the bottom of the carrier as carrier 701 passes the air knife 776. The sir knife 776 dislodges the particles, which are then get trapped in the filters.

A third particle removal arrangement is generally indicated at 780. In this arrangement, one or more exhaust fans 771 are provided on the enclosure of the elevator 708. Each exhaust fan 771 has its associated exhaust filter 772. On the opposite side, intake openings are provided, each having an intake filter 773. Thus, as the carrier 701 is lowered, the horizontal air flow created by the exhaust fan 771 dislodges particles, that are collected by the exhaust filter 772.

Various embodiments were described above, wherein each embodiment is described with respect to certain features and elements. However, it should be understood that features and elements from one embodiment may be used in conjunction with other features and elements of other embodiments, and the description is intended to cover such possibilities, albeit not all permutations are described explicitly so as to avoid clutter.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A system for fan out chip encapsulation processing, wherein a plurality of microchips are encapsulated in molding compound, the system comprising:
   an atmospheric loading camber, configured to load substrates onto carriers in atmospheric environment;
   an entry loadlock arrangement configured to introduce the carriers into vacuum environment of the system;
   a degas chamber positioned downstream of the loadlock arrangement within the vacuum environment, the degas chamber comprising a heating element and a pumping arrangement to remove gases emitted from the molding compound;
   an etch chamber positioned downstream of the degas chamber and within the vacuum environment, the etch chamber comprising an ion beam generator and an ion neutralizer;
   a metal sputtering chamber positioned downstream of the etch chamber and inside the vacuum environment; and,
   an exit loadlock arrangement configured to remove carriers from the vacuum environment;
   wherein the degas chamber comprises:
   a first compartment and a second compartment and a partition separating the first and second compartment, the partition having an opening enabling carriers to pass from the first compartment to the second compartment;
   an entry gate valve in the first compartment;
   a heater positioned in the first compartment; and,
   an exit gate valve position in the second compartment.

2. The system of claim 1, wherein the degas chamber further comprises:
   a lowering mechanism inside the first compartment configured to lower carriers one step at each processing cycle of the system;
   an elevating mechanism inside the second compartment configured to raise carriers one step at each processing cycle of the system; and,
   a linear transfer mechanism configured to horizontally transfer carriers from the first compartment to the second compartment at each processing cycle of the system.

3. The system of claim 1, wherein the degas chamber further comprises at least one cryogenic plate and at least one turbo molecular pump.

4. The system of claim 1, wherein each of the carriers comprises a heat sink having cooling fluid channels therein and a clamp for clamping the substrate over the heat sink.

5. A system for fan out chip encapsulation processing wherein a plurality of microchips are encapsulated in molding compound, the system comprising:
   an atmospheric loading camber, configured to load substrates onto carriers in atmospheric environment;
   an entry loadlock arrangement configured to introduce the carriers into vacuum environment of the system;
   a degas chamber positioned downstream of the loadlock arrangement within the vacuum environment, the degas chamber comprising a heating element and a pumping arrangement to remove gases emitted from the molding compound;
   an etch chamber positioned downstream of the degas chamber and within the vacuum environment, the etch chamber comprising an ion beam generator and an ion neutralizer;
   a metal sputtering chamber positioned downstream of the etch chamber and inside the vacuum environment;
   an exit loadlock arrangement configured to remove carriers from the vacuum environment;
   an enclosed carrier return conveyor;
   an air knife situated in the enclosed carrier return conveyor and positioned so as to inject a stream of gas to an underside of a passing carrier; and,
   an exhaust filter positioned to collect particles dislodged from the carrier by the stream of gas.

6. A system for fan out chip encapsulation processing, wherein a plurality of microchips are encapsulated in molding compound, the system comprising:
   an atmospheric loading camber, configured to load substrates onto carriers in atmospheric environment;
   an entry loadlock arrangement configured to introduce the carriers into vacuum environment of the system;
   a degas chamber positioned downstream of the loadlock arrangement within the vacuum environment, the degas chamber comprising a heating element and a pumping arrangement to remove gases emitted from the molding compound;
   an etch chamber positioned downstream of the degas chamber and within the vacuum environment, the etch chamber comprising an ion beam generator and an ion neutralizer;
   a metal sputtering chamber positioned downstream of the etch chamber and inside the vacuum environment;
   an exit loadlock arrangement configured to remove carriers from the vacuum environment; and,
   wherein the etch chamber comprises:
   a top compartment configured for sustaining plasma;
   a bottom compartment configured to form ion beam from ions extracted from the plasma;
   an extraction grid separating the top compartment and the bottom compartment, the extraction grid coupled to a voltage potential to extract ions from the plasma and into the bottom compartment; and,
   a neutralizer supplying electrons into the bottom compartment.

7. The system of claim 6, wherein the top compartment further comprises a dielectric window, and the etch chamber further comprising an RF antenna positioned above the dielectric window.

8. The system of claim 7, wherein the neutralizer comprises a plasma bridge neutralizer.

9. A system for fan out chip encapsulation processing, wherein a plurality of microchips are encapsulated in molding compound, the system comprising:
   an atmospheric loading camber, configured to load substrates onto carriers in atmospheric environment;
   an entry loadlock arrangement configured to introduce the carriers into vacuum environment of the system;
   a degas chamber positioned downstream of the loadlock arrangement within the vacuum environment, the degas chamber comprising a heating element and a pumping arrangement to remove gases emitted from the molding compound;
   an etch chamber positioned downstream of the degas chamber and within the vacuum environment, the etch chamber comprising an ion beam generator and an ion neutralizer;
   a metal sputtering chamber positioned downstream of the etch chamber and inside the vacuum environment;
   an exit loadlock arrangement configured to remove carriers from the vacuum environment; and, wherein each of the carrier comprises a heat sink, a thermal pad positioned on top of the heat sink, and a frame configured to clamp a substrate on top of the thermal pad.

10. The system of claim 9, wherein each of the carriers further comprises magnets positioned to hold the frame against the heat sink.

11. The system of claim 9, wherein each of the carriers further comprises a cover situated over the frame to thereby protect the frame from deposits.

12. A system for fan out chip encapsulation processing, wherein a plurality of microchips are encapsulated in molding compound, the system comprising:
- an atmospheric loading camber, configured to load substrates onto carriers in atmospheric environment;
- an entry loadlock arrangement configured to introduce the carriers into vacuum environment of the system;
- a degas chamber positioned downstream of the loadlock arrangement within the vacuum environment, the degas chamber comprising a heating element and a pumping arrangement to remove gases emitted from the molding compound;
- an etch chamber positioned downstream of the degas chamber and within the vacuum environment, the etch chamber comprising an ion beam generator and an ion neutralizer;
- a metal sputtering chamber positioned downstream of the etch chamber and inside the vacuum environment;
- an exit loadlock arrangement configured to remove carriers from the vacuum environment; and,
- further comprising a carrier return conveyor positioned in atmospheric environment and configured to return carriers to be loaded with fresh substrates, the carrier return conveyor comprising a particle removal arrangement configured to remove particles from the carriers.

13. The system of claim 12, further comprising a loading elevator configured to lower carriers from the carrier return conveyor to be positioned upstream of the entry load lock and a return elevator positioned upstream of the exit load lock and configured to elevate carriers onto the carrier return conveyor.

14. A system for fan out chip encapsulation processing, wherein a plurality of microchips are encapsulated in molding compound, the system comprising:
- an atmospheric loading camber, configured to load substrates onto carriers in atmospheric environment;
- an entry loadlock arrangement configured to introduce the carriers into vacuum environment of the system;
- a degas chamber positioned downstream of the loadlock arrangement within the vacuum environment, the degas chamber comprising a heating element and a pumping arrangement to remove gases emitted from the molding compound;
- an etch chamber positioned downstream of the degas chamber and within the vacuum environment, the etch chamber comprising an ion beam generator and an ion neutralizer;
- a metal sputtering chamber positioned downstream of the etch chamber and inside the vacuum environment;
- an exit loadlock arrangement configured to remove carriers from the vacuum environment; and,
- wherein the metal sputtering chamber immediately abuts the pre-clean chamber and further comprising a gate valve positioned between the pre-clean chamber and the metal sputtering chamber.

15. The system of claim 14, further comprising a plurality of deposition chambers positioned downstream of the metal sputtering chamber.

16. The system of claim 15, wherein the metal sputtering chamber comprises a titanium or a titanium-tungsten sputtering chamber, and at least one of the deposition chambers comprises a copper deposition chamber.

17. The system of claim 15, wherein the metal sputtering chamber comprises a titanium or a titanium-tungsten sputtering chamber, and at least one of the deposition chambers comprises an aluminum deposition chamber.

18. A system for fan out chip encapsulation processing, wherein a plurality of microchips are encapsulated in molding compound, the system comprising:
- an atmospheric loading camber, configured to load substrates onto carriers in atmospheric environment;
- an entry loadlock arrangement configured to introduce the carriers into vacuum environment of the system;
- a degas chamber positioned downstream of the loadlock arrangement within the vacuum environment, the degas chamber comprising a heating element and a pumping arrangement to remove gases emitted from the molding compound;
- an etch chamber positioned downstream of the degas chamber and within the vacuum environment, the etch chamber comprising an ion beam generator and an ion neutralizer;
- a metal sputtering chamber positioned downstream of the etch chamber and inside the vacuum environment;
- an exit loadlock arrangement configured to remove carriers from the vacuum environment; and,
- further comprising a loading elevator configured to deliver carriers to be loaded with substrates, the loading elevator comprising a particle removal arrangement configured to remove particles from the carriers.

* * * * *